(12) United States Patent
Okada et al.

(10) Patent No.: US 8,080,109 B2
(45) Date of Patent: Dec. 20, 2011

(54) FILM FORMATION APPARATUS AND METHOD FOR USING THE SAME

(75) Inventors: Mitsuhiro Okada, Nirasaki (JP); Satoshi Takagi, Nirasaki (JP); Ryou Son, Sendai (JP); Masahiko Tomita, Nirasaki (JP); Yamato Tonegawa, Nirasaki (JP); Toshiharu Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 741 days.

(21) Appl. No.: 12/149,537

(22) Filed: May 2, 2008

(65) Prior Publication Data

US 2008/0282976 A1    Nov. 20, 2008

(30) Foreign Application Priority Data

May 14, 2007  (JP) .................................. 2007-128149
May 14, 2007  (JP) .................................. 2007-128534

(51) Int. Cl.
*B08B 9/08*        (2006.01)
(52) U.S. Cl. ............ 134/1.1; 134/19; 134/21; 134/22.1; 438/905
(58) Field of Classification Search .................. None
See application file for complete search history.

(56) References Cited

U.S. PATENT DOCUMENTS

| 7,494,943 | B2 | 2/2009 | Noro et al. | |
|---|---|---|---|---|
| 7,938,080 | B2 | 5/2011 | Noro et al. | |
| 2004/0077511 | A1* | 4/2004 | Barnes et al. | 510/175 |
| 2006/0213539 | A1* | 9/2006 | Hasebe et al. | 134/22.1 |

FOREIGN PATENT DOCUMENTS

| JP | 3-293726 | 12/1991 |
|---|---|---|
| JP | 2007-142354 | 6/2007 |
| KR | 10-2005-0115067 | 12/2005 |
| KR | 10-2007-0043640 | 4/2007 |

OTHER PUBLICATIONS

Korean Office Action issued on Jun. 17, 2011 for Application No. 10-2008-0043927with partial English translation.

* cited by examiner

*Primary Examiner* — Michael Kornakov
*Assistant Examiner* — Ryan Coleman
(74) *Attorney, Agent, or Firm* — Smith, Gambrell & Russell, LLP

(57) ABSTRACT

A method for using a film formation apparatus for a semiconductor process includes setting an idling state where a reaction chamber of the film formation apparatus accommodates no product target substrate therein, and then, performing a purging process of removing a contaminant present in an inner surface of the reaction chamber by causing radicals to act on the inner surface of the reaction chamber. The radicals are generated by activating a purging process gas containing oxygen and hydrogen as elements.

15 Claims, 7 Drawing Sheets

| | H₂/O₂(slm) | H₂+O₂(slm) | H₂ ratio |
|---|---|---|---|
| PE13 | 1.0/1.7 | 2.7 | 37% |
| PE14 | 1.67/2.83 | 4.5 | 37% |
| PE15 | 1.7/1.0 | 2.7 | 63% |
| PE16 | 2.83/1.67 | 4.5 | 63% |
| PE17 | 3.0/1.0 | 4.0 | 75% |

| | $H_2/O_2$(slm) | $H_2+O_2$(slm) | Radical purge time (min) |
|---|---|---|---|
| PE21 | 1.0/1.7 | 2.7 | 10 |
| PE22 | 2.83/1.67 | 4.5 | 10 |
| PE23 | 1.0/1.7 | 2.7 | 60 |
| CE21 | $N_2$ | 10 | 60 |

FILM FORMATION APPARATUS AND METHOD FOR USING THE SAME

BACKGROUND OF THE INVENTION

1. Field of the Invention

The present invention relates to a film formation apparatus for a semiconductor process for forming a film on a target substrate, such as a semiconductor wafer, and also to a method for using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices, a process, such as CVD (Chemical Vapor Deposition), is performed to form a thin film, such as a silicon nitride film or silicon oxide film, on a target substrate, such as a semiconductor wafer. For example, a film formation process of this kind is arranged to form a thin film on a semiconductor wafer, as follows.

At first, the interior of the reaction tube (reaction chamber) of a heat-processing apparatus is heated by a heater at a predetermined load temperature, and a wafer boat that holds a plurality of semiconductor wafers is loaded. Then, the interior of the reaction tube is heated up to a predetermined process temperature, and gas inside the reaction tube is exhausted through an exhaust port, so that the pressure inside the reaction tube is decreased to a predetermined pressure.

Then, while the interior of the reaction tube is kept at the predetermined temperature and pressure (kept exhausted), a film formation gas is supplied through a process gas feed line into the reaction tube. For example, in the case of CVD, when a film formation gas is supplied into a reaction tube, the film formation gas causes a thermal reaction and thereby produces reaction products. The reaction products are deposited on the surface of each semiconductor wafer, and form a thin film on the surface of the semiconductor wafer.

Reaction products generated during the film formation process are deposited (adhered) not only on the surface of the semiconductor wafer, but also on, e.g., the inner surface of the reaction tube and other members, the latter being as by-product films. If the film formation process is continued while by-product films are present on the inner surface of the reaction tube, a stress is generated and causes peeling of some of the by-product films and the quartz of the reaction tube due to a difference in coefficient of thermal expansion between the quartz and by-product films. Consequently, particles are generated, and may decrease the yield of semiconductor devices to be fabricated and/or deteriorate some components of the processing apparatus.

In order to solve this problem, cleaning of the interior of the reaction tube is performed after the film formation process is repeated several times. In this cleaning, the interior of the reaction tube is heated at a predetermined temperature by a heater, and a cleaning gas, such as a mixture gas of fluorine and a halogen-containing acidic gas, is supplied into the reaction tube. The by-product films deposited on the inner surface of the reaction tube are thereby dry-etched and removed by the cleaning gas. Jpn. Pat. Appln. KOKAI Publication No. 3-293726 discloses a cleaning method of this kind. However, as described later, the present inventors have found that conventional cleaning methods of this kind may cause problems in that, when a film formation process is performed inside a reaction tube after cleaning thereof, contamination occurs on the formed film, so the yield of semiconductor devices to be manufactured is decreased

BRIEF SUMMARY OF THE INVENTION

An object of the present invention is to provide a film formation apparatus for a semiconductor process and a method for using the same, which can prevent the formed film from suffering contamination.

According to a first aspect of the present invention, there is provided a method for using a film formation apparatus for a semiconductor process, the method comprising: setting an idling state where a reaction chamber of the film formation apparatus accommodates no product target substrate therein; and then, performing a purging process of removing a contaminant present in an inner surface of the reaction chamber by causing radicals to act on the inner surface of the reaction chamber, the radicals being generated by activating a purging process gas containing oxygen and hydrogen as elements.

According to a second aspect of the present invention, there is provided a film formation apparatus for a semiconductor process, comprising: a reaction chamber configured to accommodate a target substrate; an exhaust system configured to exhaust gas from inside the reaction chamber; a film formation gas supply circuit configured to supply a film formation gas, for forming a film on the target substrate, into the reaction chamber; a cleaning gas supply circuit configured to supply a cleaning gas, for removing a by-product film derived from the film formation gas from an inner surface of the reaction chamber, into the reaction chamber; a purging process gas supply circuit configured to supply a purging process gas, for removing a contaminant from the inner surface of the reaction chamber, into the reaction chamber, the purging process gas containing oxygen and hydrogen as elements; and a control section configured to control an operation of the apparatus, wherein the control section executes setting an idling state where the reaction chamber accommodates no product target substrate therein; and then, performing a purging process of removing a contaminant present in the inner surface of the reaction chamber by causing radicals to act on the inner surface of the reaction chamber, the radicals being generated by activating the purging process gas.

According to a third aspect of the present invention, there is provided a computer readable medium containing program instructions for execution on a processor, which, when executed by the processor, cause a film formation apparatus for a semiconductor process to execute setting an idling state where a reaction chamber of the film formation apparatus accommodates no product target substrate therein; and then, performing a purging process of removing a contaminant present in an inner surface of the reaction chamber by causing radicals to act on the inner surface of the reaction chamber, the radicals being generated by activating a purging process gas containing oxygen and hydrogen as elements.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
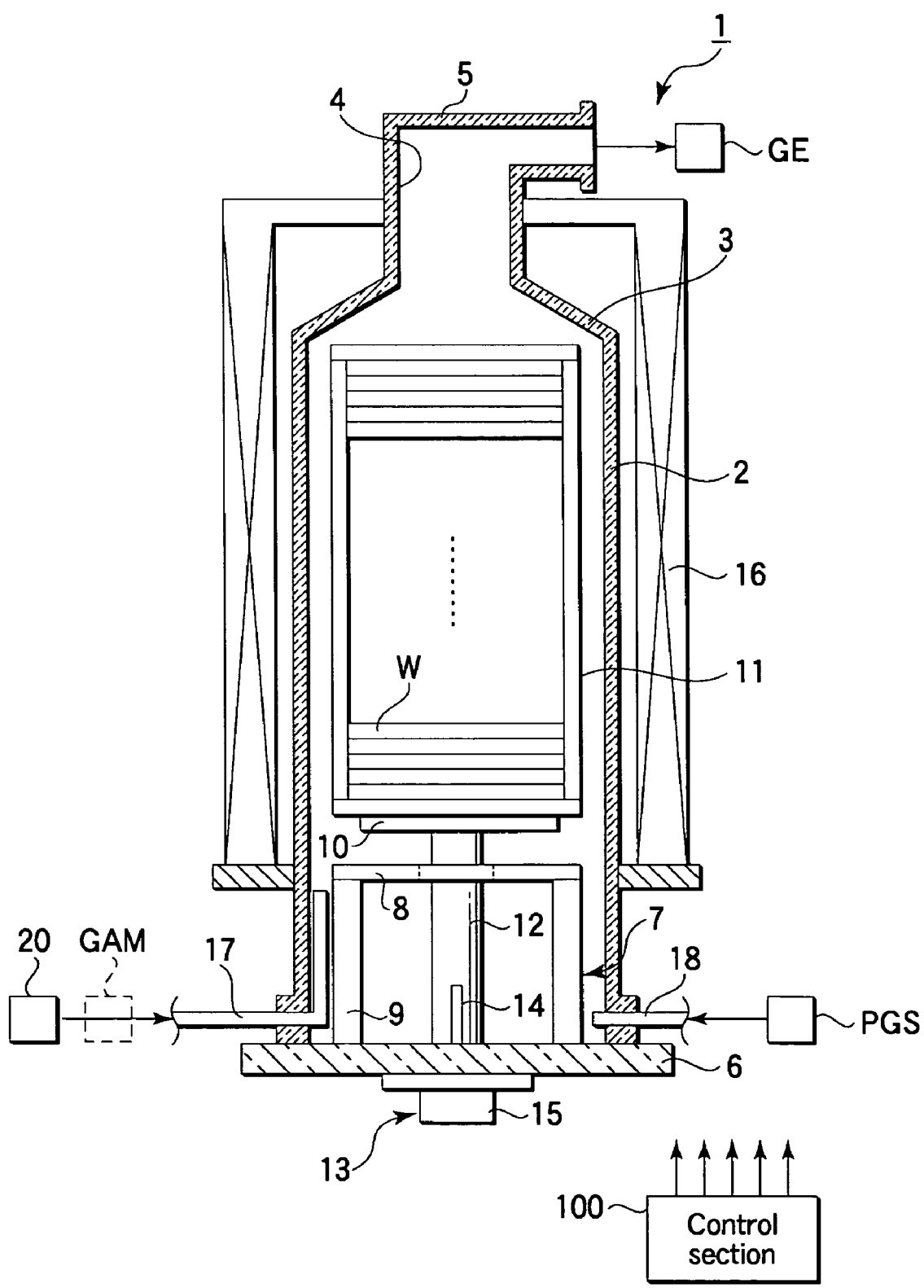
FIG. 1 is a view showing a vertical heat-processing apparatus according to an embodiment of the present invention.

In the process of developing the present invention, the inventors studied problems with regard to conventional methods for cleaning the interior of a reaction tube used in a film formation apparatus for a semiconductor process. As a result, the inventors have arrived at the findings given below.

Specifically, in a film formation apparatus of this kind, even if cleaning of the apparatus is periodically performed, metal elements, such as iron, contained in, e.g., the cleaning gas may be deposited on and/or infiltrated in the inner surface (quartz or the like) of the reaction tube. Further, apparatus components made of quartz or the like may contain metal elements, such as copper, aluminum, and iron, involved during the manufacturing process. Besides these metal elements, where a cleaning gas containing a halogen as a component is supplied into a reaction tube, the interior of the gas supply line may be corroded, and a metal compound and/or a metal element thereby produced are deposited on and/or infiltrated in the inner surface of the reaction tube. Contaminants of this kind are discharged from the inner surface of the reaction tube when a film formation process is performed under a low pressure inside the reaction tube. Consequently, contamination, such as metal contamination, occurs on the formed film, thereby decreasing the yield of semiconductor devices.

In addition, where a cleaning gas containing fluorine or hydrogen fluoride is supplied into the reaction tube, fluorine of the cleaning gas may be infiltrated in the inner surface of the reaction tube. Such contaminants are also discharged from the inner surface of the reaction tube when a film formation process is performed under a low pressure inside the reaction tube. Consequently, fluorine contamination occurs on the formed film, thereby decreasing the yield of semiconductor devices.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a view showing a vertical heat-processing apparatus according to an embodiment of the present invention. As shown in FIG. 1, the heat-processing apparatus 1 includes an essentially cylindrical reaction tube (reaction chamber) 2 whose longitudinal direction is set in the vertical direction. The reaction tube 2 is made of a heat-resistant and corrosion-resistant material, such as quartz (or silicon carbide (SiC)).

The top of the reaction tube 2 is formed as an essentially conical ceiling 3 whose diameter decreases toward the top. The ceiling 3 has an exhaust port 4 formed at the center, for exhausting gas inside the reaction tube 2. The exhaust port 4 is connected to an exhaust section GE through an airtight exhaust line 5. The exhaust section GE has a pressure adjusting mechanism including, e.g., a valve and a vacuum exhaust pump (not shown in FIG. 1, but shown in FIG. 2 with a reference symbol 127). The exhaust section GE is used to exhaust the atmosphere within the reaction tube 2, and set it at a predetermined pressure (vacuum level).

A lid 6 is disposed below the reaction tube 2. The lid 6 is made of a heat-resistant and corrosion-resistant material, such as quartz (or silicon carbide). The lid 6 is moved up and down by a boat elevator described later (not shown in FIG. 1, but shown in FIG. 2 with a reference symbol 128). When the lid 6 is moved up by the boat elevator, the bottom of the reaction tube 2 (load port) is closed. When the lid 6 is moved down by the boat elevator, the bottom of the reaction tube 2 (load port) is opened.

A thermally insulating cylinder 7 is disposed on the lid 6. The thermally insulating cylinder 7 is provided with a planar heater 8 made of a resistive heating body to prevent the temperature inside the reaction tube from decreasing due to heat radiation from the load port of the reaction tube 2. The heater 8 is supported at a predetermined height level relative to the top face of the lid 6 by a cylindrical support 9.

A rotary table 10 is disposed above the thermally insulating cylinder 7. The rotary table 10 is used as a table for rotatably mounting thereon a wafer boat 11 that holds target substrates, such as semiconductor wafers W. Specifically, the rotary table 10 is connected to a rotary shaft 12 disposed therebelow. The rotary shaft 12 passes through the center of the heater 8 and is connected to a rotation mechanism 13 for rotating the rotary table 10.

The rotation mechanism 13 is mainly formed of a motor (not shown), and a rotation feeder 15 with an axle 14 that airtightly penetrates the lid 6 from below. The axle 14 is coupled to the rotary shaft 12 of the rotary table 10, to transmit the rotational force of the motor to the rotary table 10 through the rotary shaft 12. When the axle 14 is rotated by the motor of the rotation mechanism 13, the rotational force of the axle 14 is transmitted to the rotary shaft 12, and the rotary table 10 is rotated.

The wafer boat 11 is configured to hold a plurality of, such as 100, semiconductor wafers W at predetermined intervals in the vertical direction. The wafer boat 11 is made of a heat-resistant and corrosion-resistant material, such as quartz (or silicon carbide). Since the wafer boat 11 is mounted on the rotary table 10, the wafer boat 11 is rotated along with the rotary table 10, and thus the semiconductor wafers W held in the wafer boat 11 are rotated.

A heater 16 made of, e.g., a resistive heating body is disposed near the reaction tube 2 to surround the tube 2. The interior of the reaction tube 2 is heated by the heater 16, so that the semiconductor wafers W are heated up (increase in temperature) to a predetermined temperature.

Process gas feed lines 17 penetrate the sidewall of the reaction tube 2 near the bottom, and are used for supplying process gases (such as a film formation gas, a cleaning gas, and a purging process gas) into the reaction tube 2. Each of the process gas feed lines 17 is connected to a process gas supply section 20 through a mass-flow controller (MFC) (not shown).

For example, as a film formation gas for forming a silicon nitride film (product film) on semiconductor wafers W by CVD, a first film formation gas containing a silane family gas and a second film formation gas containing a nitriding gas are used. In this embodiment, the silane family gas is dichlorosilane (DCS: $SiH_2Cl_2$) or hexachlorodisilane (HCD: $Si_2Cl_6$) gas and the nitriding gas is ammonia ($NH_3$) gas.

As a cleaning gas for removing by-product films, which contain silicon nitride as the main component (it means 50% or more), deposited inside the reaction tube 2, a halogen-containing acidic gas or a mixture gas of a halogen gas and hydrogen gas is used. In this embodiment, the cleaning gas is a mixture gas of fluorine ($F_2$) gas, hydrogen ($H_2$) gas, and nitrogen ($N_2$) gas used as a dilution gas.

As a purging process gas for removing contaminants present at the inner surface of the reaction tube 2, a gas that contains oxygen and hydrogen as elements and can be activated is used. As described later, in a method according to a first embodiment of the present invention, the purging process gas is used as a metal removing gas for removing metal elements present at the inner surface of the reaction tube 2. In a method according to a second embodiment of the present invention, the purging process gas is used as a fluorine removing gas for removing fluorine elements present at the inner surface of the reaction tube 2. A purging process gas common to the first and second embodiments is a mixture gas of oxygen ($O_2$) gas, hydrogen ($H_2$) gas, and nitrogen ($N_2$) gas used as a dilution gas. It should be noted that the nitrogen gas is mixed to prevent apparatus corrosion and/or to adjust gas concentration, but the nitrogen gas is not mixed as the case may be.

Although FIG. 1 shows only one process gas feed line 17, a plurality of process gas feed lines 17 are disposed in accordance with the type of gases in this embodiment. Specifically, this apparatus includes six process gas feed lines 17 penetrating the sidewall of the reaction tube 2 near the bottom, which are formed of a DCS feed line for supplying DCS, an ammonia feed line for supplying ammonia, a fluorine feed line for supplying fluorine, a hydrogen feed line for supplying hydrogen, an oxygen feed line for supplying oxygen, and a nitrogen feed line for supplying nitrogen.

A purge gas supply line 18 also penetrates the sidewall of the reaction tube 2 near the bottom. The purge gas supply line 18 is connected to a supply source PGS of a purge gas (such as nitrogen gas) through a mass-flow controller (MFC) (not shown).

Figure 2:
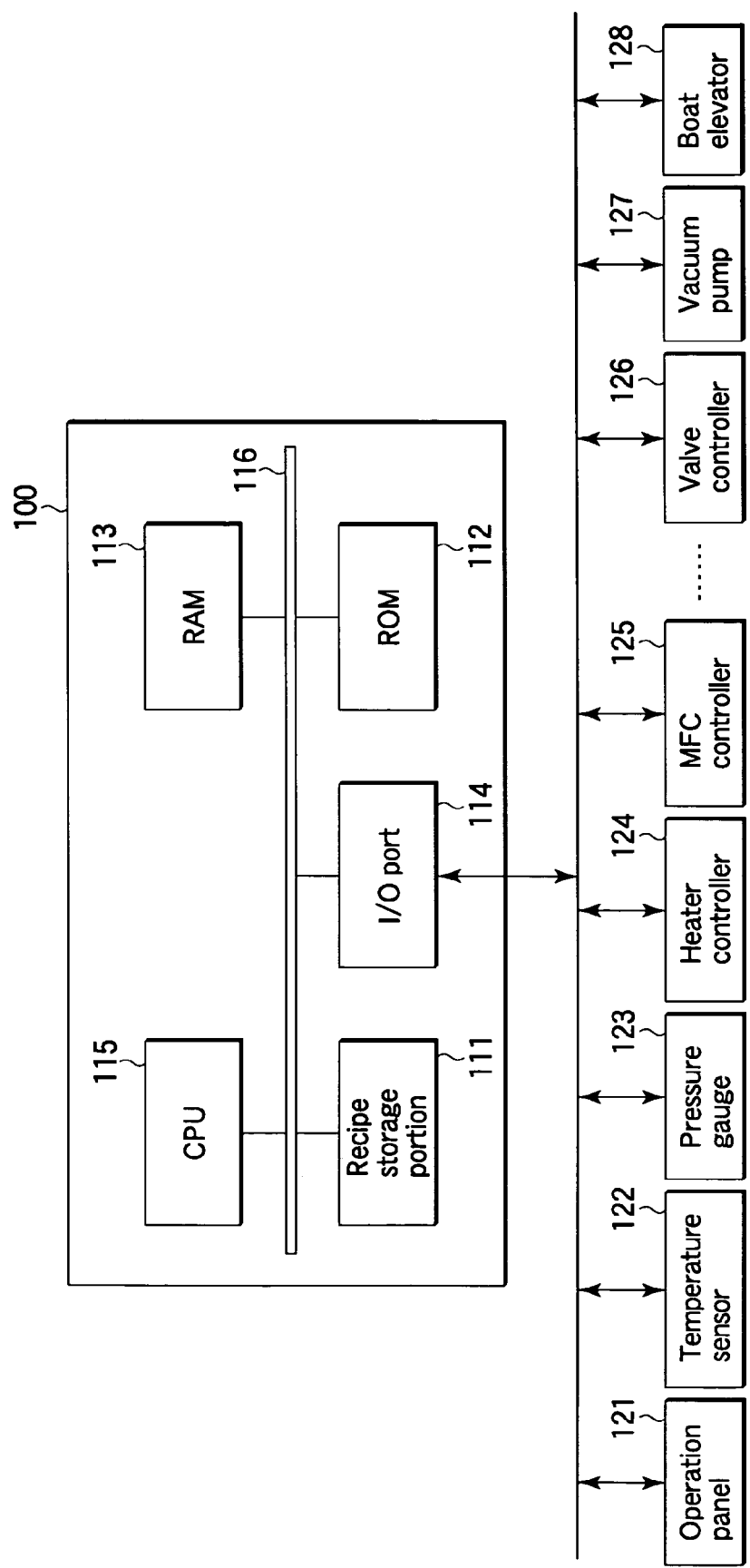
FIG. 2 is a view showing the structure of the control section of the apparatus shown in FIG. 1.

The heat-processing apparatus 1 further includes a control section 100 for controlling respective portions of the apparatus. FIG. 2 is a view showing the structure of the control section 100. As shown in FIG. 2, the control section 100 is connected to an operation panel 121, (a group of) temperature sensors 122, (a group of) pressure gages 123, heater controllers 124, MFC controllers 125, valve controllers 126, a vacuum pump 127, a boat elevator 128, and so forth.

The operation panel 121 includes a display screen and operation buttons, and is configured to transmit operator's instructions to the control section 100, and show various data transmitted from the control section 100 on the display screen. The (group of) temperature sensors 122 are configured to measure the temperature at respective portions inside the reaction tube 2, exhaust line 5, and process gas feed lines 17, and to transmit measurement values to the control section 100. The (group of) pressure gages 123 are configured to measure the pressure at respective portions inside the reaction tube 2, exhaust line 5, and process gas feed lines 17, and to transmit measurement values to the control section 100.

The heater controllers 124 are configured to respectively control the heater 8 and heater 16. The heater controllers 124 turn on these heaters to generate heat in accordance with instructions from the control section 100. Further, the heater controllers 124 measure the power consumption of these heaters, and transmit it to the control section 100.

The MFC controllers 125 are configured to respectively control the MFCs (not shown) disposed on the process gas feed lines 17 and the purge gas supply line 18. The MFC controllers 125 control the flow rates of gases flowing through the MFCs in accordance with instructions from the control section 100. Further, the MFC controllers 125 measure the flow rates of gases flowing through the MFCs, and transmit them to the control section 100.

The valve controllers 126 are respectively disposed on piping lines and configured to control the opening rate of valves disposed on piping lines in accordance with instructed values received from the control section 100. The vacuum pump 127 is connected to the exhaust line 5 and configured to exhaust gas from inside the reaction tube 2.

The boat elevator 128 is configured to move up the lid 6, so as to load the wafer boat 11 (semiconductor wafers W) placed on the rotary table 10 into the reaction tube 2. The boat elevator 128 is also configured to move the lid 6 down, so as to unload the wafer boat 11 (semiconductor wafers W) placed on the rotary table 10 from the reaction tube 2.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the heat-processing apparatus 1 is manufactured, only the setup recipe is initially stored. The setup recipe is executed when a thermal model or the like for a specific heat-processing apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time semiconductor wafers W are loaded into the reaction tube 2 to the time processed wafers W are unloaded.

The ROM 112 is a storage medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controllers 124, MFC controllers 125, valve controllers 126, vacuum pump 127, and boat elevator 128, and is configured to control output/input of data or signals.

The CPU (Central Processing Unit) 115 is the hub of the control section 100. The CPU 115 is configured to run control programs stored in the ROM 112, and control an operation of the heat-processing apparatus 1, in accordance with a recipe (process recipe) stored in the recipe storage portion 111, following instructions from the operation panel 121. Specifically, the CPU 115 causes the (group of) temperature sensors 122, (group of) pressure gages 123, and MFC controllers 125 to measure temperatures, pressures, and flow rates at respective portions inside the reaction tube 2, exhaust line 5, and process gas feed lines 17. Further, the CPU 115 outputs control signals, based on measurement data, to the heater controllers 124, MFC controllers 125, valve controllers 126, and vacuum pump 127, to control the respective portions mentioned above in accordance with a process recipe.

Accordingly, in apparatus usage methods described below according to embodiments, the respective components of the heat-processing apparatus 1 are operated under the control of the control section 100 (CPU 115). The temperature and pressure inside the reaction tube 2 and the gas flow rates during the processes are set in accordance with a recipe, while the control section 100 (CPU 115) controls the heater controller 124 (for the heaters 8 and 16), MFC controllers 125 (for the process gas feed lines 17 and purge gas feed line 18), valve controllers 126, and vacuum pump 127, as explained below.

FIRST EMBODIMENT

Figure 3:
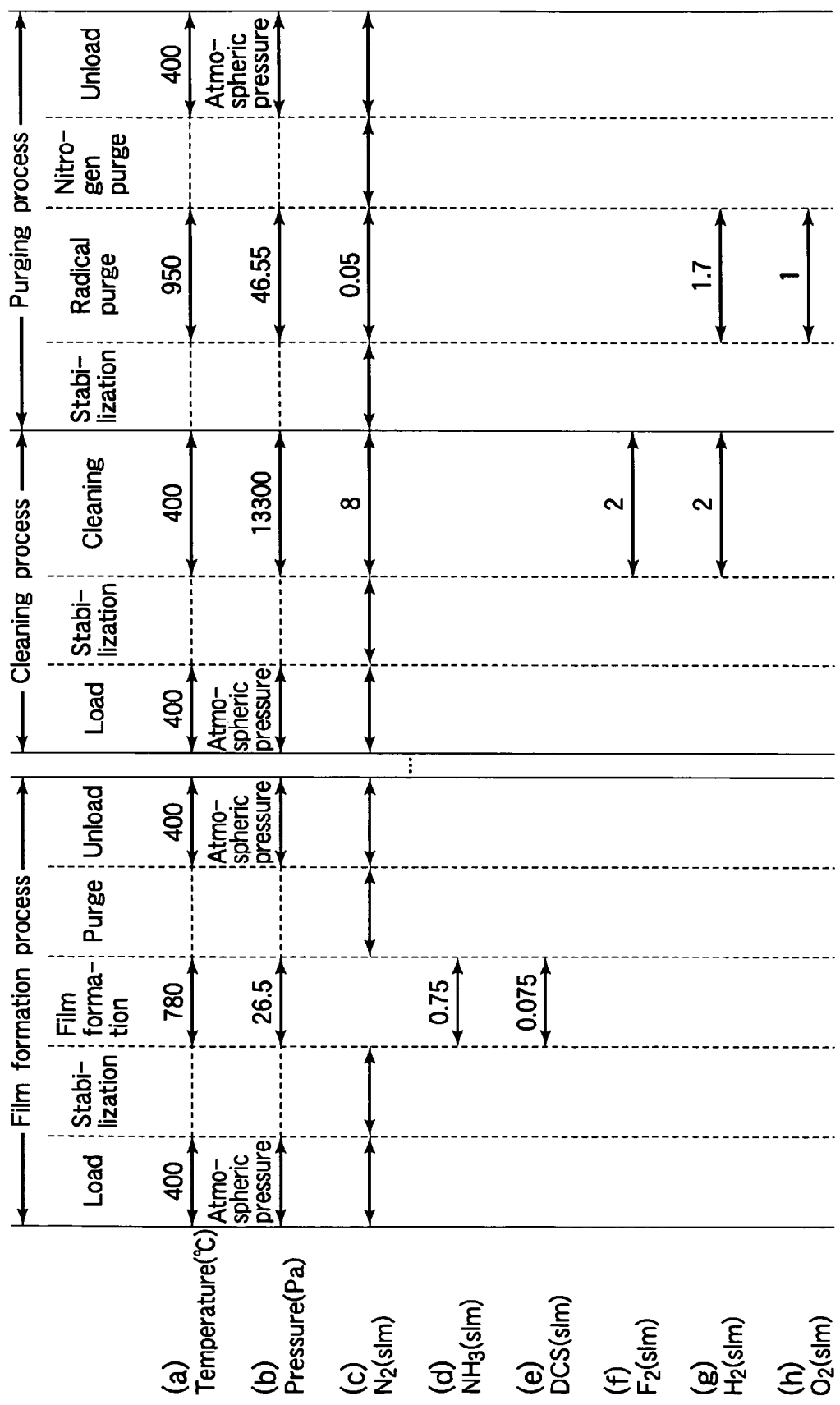
FIG. 3 is a view showing the recipe of a film formation process, a cleaning process, and a purging process according to a first embodiment of the present invention.

Next, an explanation will be given of an apparatus usage method according to a first embodiment of the present invention performed in the heat-processing apparatus 1 shown in FIGS. 1 and 2. In this embodiment, at first, a silicon nitride film is formed on semiconductor wafers W within the reaction tube 2. Then, by-product films, which contain silicon nitride as the main component (it means 50% or more), deposited inside the reaction tube 2 are removed. Then, metal contaminants present at the inner surface of the reaction tube 2 and so forth are removed. FIG. 3 is a view showing the recipe of a film formation process, a cleaning process, and a purging process according to a first embodiment of the present invention.

In the film formation process, at first, the interior of the reaction tube 2 is heated by the heater 16 at a predetermined load temperature, such as 400° C., as shown in FIG. 3, (a). Further, nitrogen ($N_2$) is supplied through the purge gas feed line 18 into the reaction tube 2 at a predetermined flow rate, as shown in FIG. 3, (c). Then, a wafer boat 11 that holds semiconductor wafers W is placed on the lid 6, and the lid 6 is moved up by the boat elevator 128. Consequently, the wafer boat 11 with the semiconductor wafers W supported thereon is loaded into the reaction tube 2 and the reaction tube 2 is airtightly closed (load step).

Then, nitrogen is supplied through the purge gas feed line 18 into the reaction tube 2 at a predetermined flow rate, as shown in FIG. 3, (c). Further, the interior of the reaction tube 2 is heated by the heater 16 to a predetermined film formation temperature (process temperature), such as 780° C., as shown in FIG. 3, (a). Furthermore, gas inside the reaction tube 2 is exhausted to set the interior of the reaction tube 2 at a predetermined pressure, such as 26.5 Pa (0.2 Torr), as shown in FIG. 3, (b). The pressure reduction and heating operations are kept performed until the reaction tube 2 is stabilized at the predetermined pressure and temperature (stabilization step).

The motor of the rotation mechanism 13 is controlled to rotate the wafer boat 11 through the rotary table 10. The wafer boat 11 is rotated along with the semiconductor wafers W supported thereon, thereby uniformly heating the semiconductor wafers W.

When the interior of the reaction tube 2 is stabilized at the predetermined pressure and temperature, the supply of nitrogen through the purge gas feed line 18 is stopped. Then, a first film formation gas containing a silicon-containing gas and a second film formation gas containing a nitriding gas are supplied through process gas feed lines 17 into the reaction tube 2. In this embodiment, the first film formation gas contains DCS ($SiH_2Cl_2$) supplied at a predetermined flow rate, such as 0.075 slm (standard liters per minute), as shown in FIG. 3, (e). The second film formation gas contains ammonia ($NH_3$) supplied at a predetermined flow rate, such as 0.75 slm, as shown in FIG. 3, (d).

The DCS and ammonia supplied into the reaction tube 2 cause a thermal decomposition reaction, using heat inside the reaction tube 2. The decomposition components produce silicon nitride ($Si_3N_4$), from which a silicon nitride film is formed on the surface of the semiconductor wafers W (film formation step).

When the silicon nitride film formed on the surface of the semiconductor wafers W reaches a predetermined thickness, the supply of DCS and ammonia through the process gas feed lines 17 is stopped. Then, the interior of the reaction tube 2 is exhausted, and nitrogen is supplied through the purge gas feed line 18 at a predetermined flow rate, as shown in FIG. 3, (c). By doing so, the gas inside the reaction tube 2 is exhausted to the exhaust line 5 (purge step). It is preferable to perform cyclic purge of repeating the gas exhaust and nitrogen gas supply for the interior of the process tube 2 a plurality of times, in order to reliably exhaust the gas inside the process tube 2.

Then, the interior of the reaction tube 2 is set by the heater 16 at a predetermined temperature, such as 400° C., as shown in FIG. 3, (a). Further, nitrogen is supplied through the purge gas feed line 18 into the reaction tube 2 at a predetermined flow rate, as shown in FIG. 3, (c). The pressure inside the process tube 2 is thereby returned to atmospheric pressure, as shown in FIG. 3, (b). Then, the lid 6 is moved down by the boat elevator 128, and the wafer boat 11 is thereby unloaded (unload step).

Repeating this film formation process a plurality of times, silicon nitride produced by the film formation process is deposited (adhered) not only on the surface of semiconductor wafers W, but also on the inner surface of the reaction tube 2 and so forth, as by-product films. Accordingly, after the film formation process is repeated a plurality of times, a cleaning process is performed to remove the by-product films containing silicon nitride as the main component. The conditions of the cleaning process are arranged such that the etching rate for silicon nitride is higher and the etching rate for the material (quartz) forming the inner surface of the reaction tube 2 is lower. Further, in the first embodiment, a purging process is performed to remove metal contaminants that appear on the inner surface of the reaction tube 2 when the by-product films are removed therefrom by the cleaning process. Hence, the conditions of the purging process are arranged to promote discharge of metal contaminants, such as iron, copper, nickel, aluminum, cobalt, sodium, and calcium, from the inner surface of the reaction tube 2 and so forth.

In the cleaning process, at first, the interior of the reaction tube 2 is maintained by the heater 16 at a predetermined load temperature, such as 400° C., as shown in FIG. 3, (a). Further, nitrogen is supplied through the purge gas feed line 18 into the reaction tube 2 at a predetermined flow rate, as shown in FIG. 3, (c). Then, the wafer boat 11 in an empty state with no semiconductor wafers W supported thereon is placed on the lid 6, and the lid 6 is moved up by the boat elevator 128. Consequently, the wafer boat 11 is loaded into the reaction tube 2 and the reaction tube 2 is airtightly closed (load step).

Then, nitrogen is supplied through the purge gas feed line 18 into the reaction tube 2 at a predetermined flow rate, as shown in FIG. 3, (c). Further, the interior of the reaction tube 2 is heated by the heater 16 at a predetermined cleaning temperature, such as 400° C., as shown in FIG. 3, (a). Furthermore, gas inside the reaction tube 2 is exhausted to set the interior of the reaction tube 2 at a predetermined pressure, such as 13,300 Pa (100 Torr), as shown in FIG. 3, (b). The pressure reduction and heating operations are kept performed until the reaction tube 2 is stabilized at the predetermined pressure and temperature (stabilization step).

When the interior of the reaction tube 2 is stabilized at the predetermined pressure and temperature, the supply of nitrogen through the purge gas feed line 18 is stopped. Then, the cleaning gas comprising fluorine ($F_2$), hydrogen ($H_2$), and nitrogen ($N_2$) is supplied through process gas feed lines 17 into the reaction tube 2. In this embodiment, fluorine is supplied at a predetermined flow rate, such as 2 slm, as shown in FIG. 3, (f), hydrogen is supplied at a predetermined flow rate, such as 2 slm, as shown in FIG. 3(g), and nitrogen or dilution gas is supplied at a predetermined flow rate, such as 8 slm, as shown in FIG. 3, (c).

The cleaning gas is heated in the reaction tube 2, and fluorine in the cleaning gas is activated. The activated fluorine comes into contact with by-product films (containing silicon nitride as the main component) deposited on the inner surface of the reaction tube 2 and so forth. Consequently, the by-product films are etched and removed (cleaning step).

In the cleaning step, the temperature inside the reaction tube 2 is preferably set to be 100 to 600° C., and more preferably to be 200 to 400° C. If the temperature is lower than 100° C., the cleaning gas is hardly activated, so the etching rate of the cleaning gas for silicon nitride may be lower than the necessary value. If the temperature is higher than 600° C., the etching rate for quartz or silicon carbide (SiC) may become too high, so the etching selectivity is deteriorated.

In the cleaning step, the pressure inside the reaction tube 2 is preferably set to be 13,300 Pa (100 Torr) to 80,000 Pa (600 Torr), and more preferably to be 26,700 Pa (200 Torr) to 53,300 Pa (400 Torr). Where this range is used, the etching rate for silicon nitride is high, so the etching selectivity thereon against quartz or silicon carbide (SiC) is improved.

When the by-product films deposited inside the reaction tube 2 are removed, the supply of the cleaning gas through the process gas feed lines 17 is stopped. Then, the purging process is started.

In the purging process, at first, the interior of the reaction tube 2 is exhausted, and nitrogen is supplied through the purge gas feed line 18 into the reaction tube 2 at a predetermined flow rate, as shown in FIG. 3, (c). By doing so, the gas inside the reaction tube 2 is exhausted to the exhaust line 5. Further, the interior of the reaction tube 2 is set by the heater 16 at a predetermined temperature, such as 950° C., as shown in FIG. 3, (a). Furthermore, the interior of the reaction tube 2 is set at a predetermined pressure, such as 46.55 Pa (0.35 Torr), as shown in FIG. 3, (b). These operations are kept performed until the reaction tube 2 is stabilized at the predetermined pressure and temperature (stabilization step).

When the interior of the reaction tube 2 is stabilized at the predetermined pressure and temperature, the supply of nitrogen through the purge gas feed line 18 is stopped. Then, the purging process gas comprising oxygen ($O_2$), hydrogen ($H_2$), and nitrogen ($N_2$), which serves as a metal removing gas for removing metal elements present at the inner surface of the reaction tube 2, is supplied through process gas feed lines 17 into the reaction tube 2. In this embodiment, oxygen is supplied at a predetermined flow rate, such as 1 slm, as shown in FIG. 3, (h), hydrogen is supplied at a predetermined flow rate, such as 1.7 slm, as shown in FIG. 3(g), and nitrogen or dilution gas is supplied at a predetermined flow rate, such as 0.05 slm, as shown in FIG. 3, (c).

The purging process gas is heated in the reaction tube 2, and oxygen and hydrogen in the purging process gas are activated, so that radicals (oxygen radicals (O*), hydroxyl group radicals (OH*), and hydrogen radicals (H*) are generated. The radicals thus generated stimulate the metal elements present on and/or in the surface of members, such as the reaction tube 2, to be diffused and discharged (purge out). Then, the metal elements are exhausted out of the reaction tube 2 while being carried by the exhaust gas flow. Consequently, the reaction tube 2 is prevented from discharging metal contaminants therefrom during the film formation process, whereby contamination, such as metal contamination, is suppressed on the formed film (radical purge step).

In the radical purge step, supply and stop of the purging process gas may be repeated a plurality of times. At this time, since the interior of the reaction tube 2 is kept exhausted, the pressure inside the reaction tube 2 changes along with supply and stop of the purging process gas, so that metal contaminants present in the surface of the reaction tube 2 and so forth are reliably discharged.

In order to efficiently generate radicals, the combined flow rate of hydrogen and oxygen in the purging process gas should be larger, and, for example, it is set to be 0.1 slm to 20 slm, and preferably to be 1 slm to 5 slm. The ratio of the combined flow rate of hydrogen and oxygen relative to the total flow rate of the purging process gas is set to be 90 to 100%, and preferably to be 95 to 100%. The ratio of the flow rate of hydrogen relative to the combined flow rate of hydrogen and oxygen is set to be 1% to 99%, preferably to be 30% to 70%, and more preferable to be more than 50%. Where the purging process is performed under such conditions, the effect of removing metal elements present at the inner surface of the reaction tube 2 is improved.

In the radical purge step, the temperature inside the reaction tube 2 is set to be 400° C. to 1,050° C. If this temperature is lower than 400° C., metal elements present in the surface of the reaction tube 2 and so forth cannot be easily discharged (diffused). If this temperature is higher than 1,050° C., it exceeds the softening point of quartz constituting the reaction tube 2. This temperature is preferably set to be 600° C. to 1,050° C., and more preferably to be 800° C. to 1,050° C. Where this range is used, discharge of metal elements is promoted in the radical purge step.

In the radical purge step, the pressure inside the reaction tube 2 during gas supply is set to be 931 Pa (7 Torr) or less. If this pressure is higher than 931 Pa, metal contaminants cannot be easily discharged from quartz of the reaction tube 2. This pressure is preferably set to be 13.3 Pa (0.1 Torr) to 532 Pa (4 Torr), and more preferably to be 13.3 Pa (0.1 Torr) to 133 Pa (1 Torr). Where the pressure inside the reaction tube 2 is set at such a low value, discharge of metal elements is promoted in the radical purge step.

After the radical purge step is finished, the supply of the purging process gas through the process gas feed lines 17 is stopped. Then, the interior of the reaction tube 2 is exhausted, and nitrogen is supplied through the purge gas feed line 18 into the reaction tube 2 at a predetermined flow rate, as shown in FIG. 3, (c). By doing so, the gas inside the reaction tube 2 is exhausted to the exhaust line 5 (nitrogen purge step).

Then, the interior of the reaction tube 2 is set by the heater 16 at a predetermined temperature, such as 400° C., as shown in FIG. 3, (a). Further, nitrogen is supplied through the purge gas supply line 18 into the reaction tube 2 at a predetermined flow rate, as shown in FIG. 3, (c). The pressure inside the process tube 2 is thereby returned to atmospheric pressure, as shown in FIG. 3, (b). Then, the lid 6 is moved down by the boat elevator 128, and the wafer boat 11 is thereby unloaded (unload step).

As the processes described above are being performed, the by-product films and metal contaminants present at the inner surface of the reaction tube 2, the surface of the wafer boat 11, and so forth are removed. Thereafter, the wafer boat 11 with a new lot of semiconductor wafers W supported thereon is placed on the lid 6, and the film formation process is started again in the manner described above.

Experiment 1

As present examples PE11 and PE12 of the first embodiment, the film formation process, cleaning process, and purging process were performed under conditions in accordance with those described in the embodiment, in the heat-processing apparatus shown in FIGS. 1 and 2, so that the reaction tube 2 was prepared. In the present examples PE11 and PE12, the temperature inside the reaction tube 2 during the radical purge step was set at 950° C. and 850° C., respectively. As a comparative example CE11, the film formation process and cleaning process were performed under the same conditions as those of the present example PE11, and then only nitrogen purge was performed in place of the purging process, so that the reaction tube 2 was prepared. Semiconductor wafers were loaded into each reaction tube 2 thus prepared, and then the interior of the reaction tube 2 was heated to 800° C. to perform a heat process on the semiconductor wafers. Then, the semiconductor wafers were unloaded from the reaction tube 2, and the concentration (atoms/cm$^2$) of iron (Fe), copper (Cu), and nickel (Ni) on the wafer surface was measured.

Figures 4, 5:
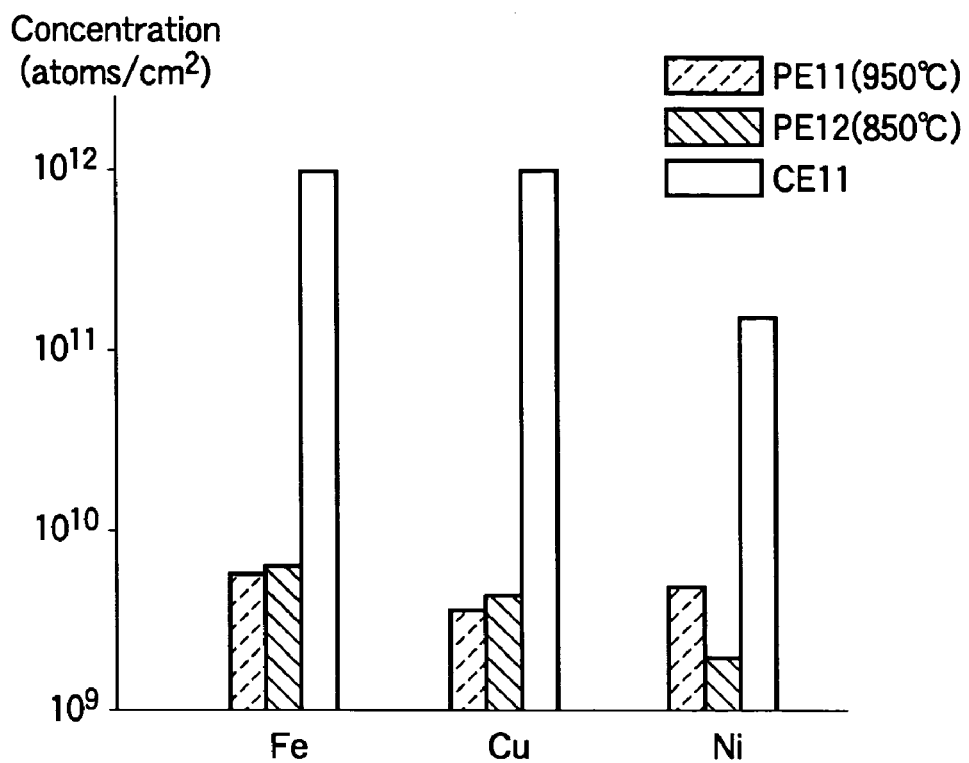
FIG. 4 is a graph showing the concentration of iron, copper, and nickel on a semiconductor wafer surface, in present examples PE11 and PE12 of the first embodiment and a comparative example CE11, obtained by an experiment 1.
FIG. 5 is a diagram showing the composition and so forth of metal removing gases (purging process gases) respectively used for present examples PE13 to PE17 of the first embodiment in an experiment 2.

FIG. 4 is a graph showing the concentration of iron, copper, and nickel on the semiconductor wafer surface, in the present examples PE11 and PE12 and the comparative example CE11, obtained by the experiment 1. As shown in FIG. 4, the concentration of iron, copper, and nickel on the semiconductor wafer surface became far lower in the present examples with the purging process. This data means that the purging process greatly decreases metal elements remaining inside the reaction tube 2.

As regards the relationship between the temperature inside the reaction tube 2 during the radical purge step and the metal concentration on the semiconductor wafer surface, the concentration of iron and copper was lower at 950° C., while the concentration of nickel was lower at 850° C. The temperature inside the reaction tube 2 during the radical purge step suffices, only if it can activate the purging process gas and thereby generate radicals thereof. However, there is an optimum temperature depending on a metal to be removed, so a suitable temperature is preferably selected in accordance with the metal type in question.

Experiment 2

As present examples PE13, PE14, PE15, PE16, and PE17 of the first embodiment, the reaction tube 2 was prepared and used for performing a heat process on semiconductor wafers, under the same conditions as those of the present example PE11 except that the composition of the purging process gas was change. After the heat process, the concentration (atoms/cm$^2$) of iron (Fe), copper (Cu), and nickel (Ni) on the wafer surface was measured. FIG. 5 is a diagram showing the composition and so forth of metal removing gases (purging process gases) respectively used for present examples PE13 to PE17 of the first embodiment in an experiment 2.

Figure 6:
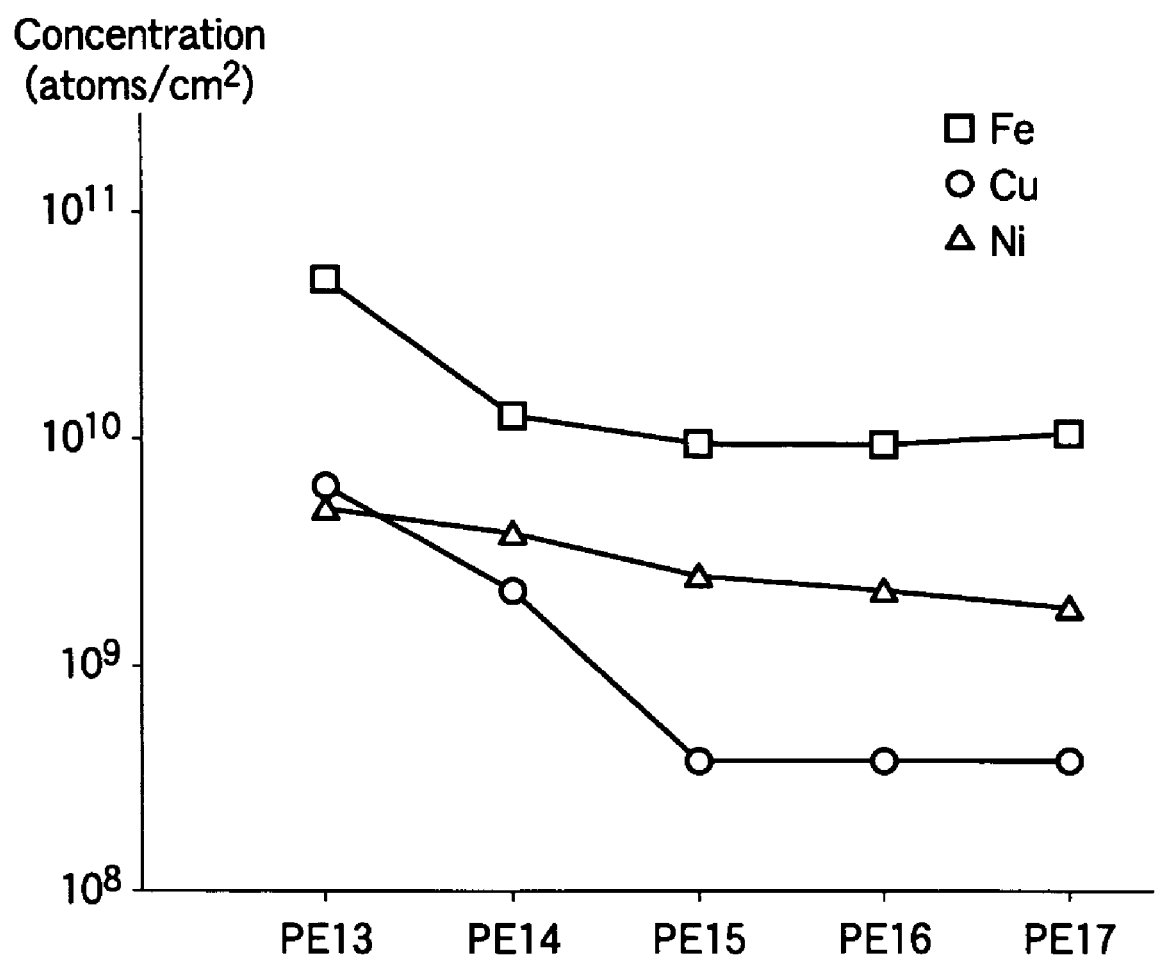
FIG. 6 is a graph showing the concentration of iron, copper, and nickel on a semiconductor wafer surface, in the present examples PE13 to PE17 obtained by the experiment 2.

FIG. 6 is a graph showing the concentration of iron, copper, and nickel on the semiconductor wafer surface, in the present examples PE13 to PE17 obtained by the experiment 2. As shown in FIG. 6, with an increase in the ratio of hydrogen in the purging process gas, the concentration of iron, copper, and nickel on the semiconductor wafers was decreased. This was caused supposedly because an increase in the hydrogen ratio brought about an increase in radicals effective in removing metal elements.

SECOND EMBODIMENT

Figure 7:
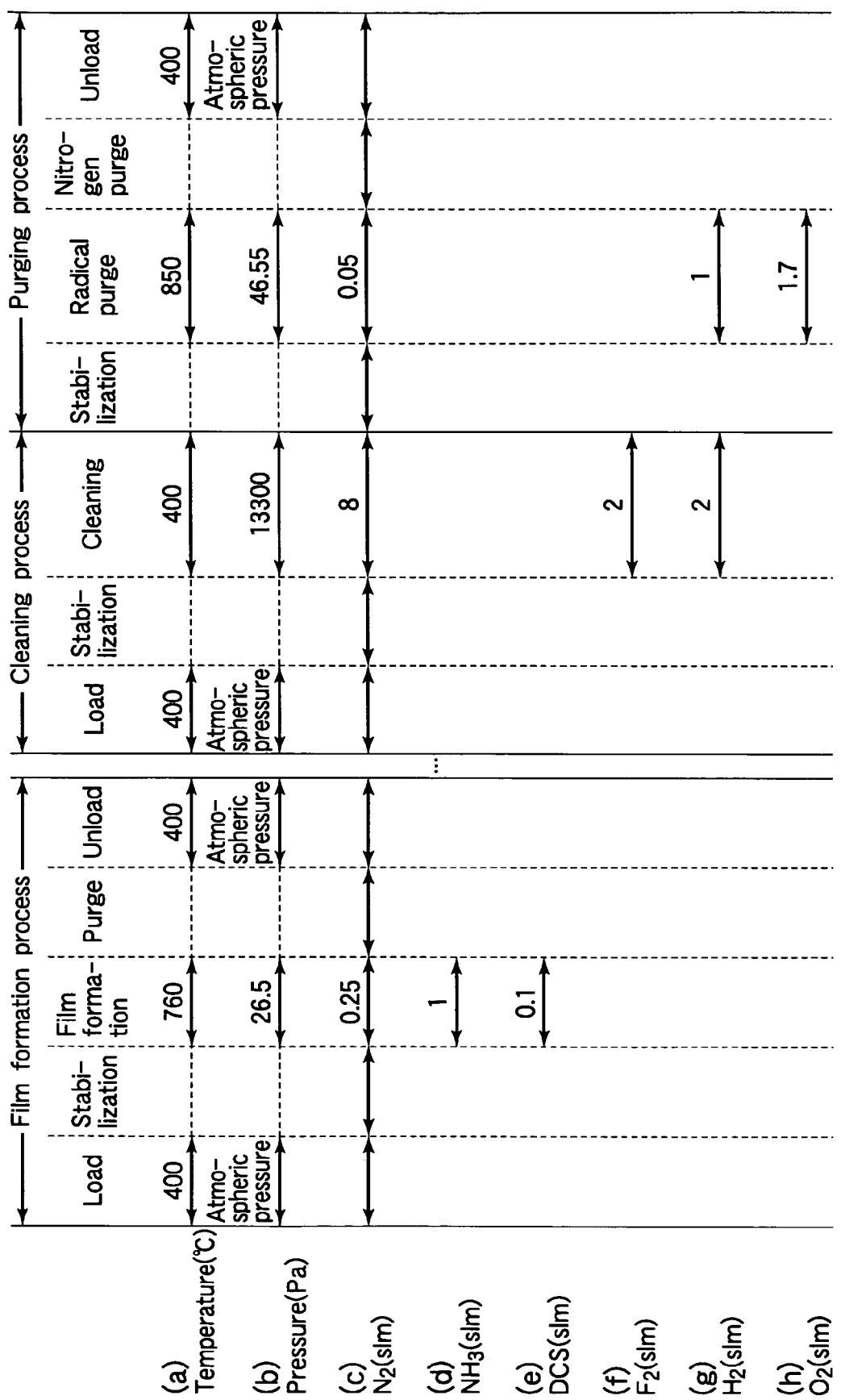
FIG. 7 is a view showing the recipe of a film formation process, a cleaning process, and a purging process according to a second embodiment of the present invention.

Next, an explanation will be given of an apparatus usage method according to a second embodiment of the present invention performed in the heat-processing apparatus 1 shown in FIGS. 1 and 2. In this embodiment, at first, a silicon nitride film is formed on semiconductor wafers W within the reaction tube 2. Then, by-product films, which contain silicon nitride as the main component (it means 50% or more), deposited inside the reaction tube 2 are removed. Then, fluorine contaminants present at the inner surface of the reaction tube 2 and so forth are removed. FIG. 7 is a view showing the recipe of a film formation process, a cleaning process, and a purging process according to a second embodiment of the present invention.

In the film formation process, the respective steps are performed by use of the same conditions and manners as those of the first embodiment, except that the process temperature of the film formation step is set at 760° C. and the film formation gas is set to supply DCS (SiH$_2$Cl$_2$) at 0.1 slm, ammonia (NH$_3$) at 1 slm, and nitrogen (N$_2$) at 0.25 slmm, as shown in FIG. 7.

After the film formation process is repeated a plurality of times, a cleaning process is performed. In the cleaning process, the respective steps are performed by use of the same conditions and manners as those of the first embodiment, wherein the cleaning gas is formed of fluorine (F$_2$), hydrogen (H$_2$), and nitrogen (N$_2$) supplied into the reaction tube 2, as shown in FIG. 7. Consequently, fluorine elements are adsorbed on and/or infiltrated in the surface of the reaction tube 2 and so forth, and are left as contaminants. In order to remove such fluorine contaminants, a purging process is performed. Hence, the conditions of the purging process are arranged to promote discharge of fluorine contaminants from the inner surface of the reaction tube 2 and so forth.

In the purging process, at first, the interior of the reaction tube 2 is exhausted, and nitrogen is supplied through the purge gas feed line 18 into the reaction tube 2 at a predetermined flow rate, as shown in FIG. 7, (c). By doing so, the gas inside the reaction tube 2 is exhausted to the exhaust line 5. Further, the interior of the reaction tube 2 is set by the heater 16 at a predetermined temperature, such as 850° C., as shown in FIG. 7, (a). Furthermore, the interior of the reaction tube 2 is set at a predetermined pressure, such as 46.55 Pa (0.35 Torr), as shown in FIG. 7, (b). These operations are kept performed until the reaction tube 2 is stabilized at the predetermined pressure and temperature (stabilization step).

When the interior of the reaction tube 2 is stabilized at the predetermined pressure and temperature, the supply of nitrogen through the purge gas feed line 18 is stopped. Then, the purging process gas comprising oxygen (O$_2$), hydrogen (H$_2$), and nitrogen (N$_2$), which serves as a fluorine removing gas for removing fluorine elements present at the inner surface of the reaction tube 2, is supplied through process gas feed lines 17 into the reaction tube 2. In this embodiment, oxygen is supplied at a predetermined flow rate, such as 1.7 slm, as shown in FIG. 7, (h), hydrogen is supplied at a predetermined flow rate, such as 1 slm, as shown in FIG. 7 (g), and nitrogen or dilution gas is supplied at a predetermined flow rate, such as 0.05 slm, as shown in FIG. 7, (c).

The purging process gas is heated in the reaction tube 2, and oxygen and hydrogen in the purging process gas are activated, so that radicals (oxygen radicals (O*), hydroxyl group radicals (OH*), and hydrogen radicals (H*) are generated. The radicals thus generated stimulate the fluorine elements present on and/or in the surface of members, such as the reaction tube 2, to be diffused and discharged (purge out). Then, the fluorine elements are exhausted out of the reaction tube 2 while being carried by the exhaust gas flow. Consequently, the reaction tube 2 is prevented from discharging fluorine contaminants therefrom during the film formation process, whereby contamination, such as fluorine contamination, is suppressed on the formed film (radical purge step).

In the radical purge step, supply and stop of the purging process gas may be repeated a plurality of times. At this time, since the interior of the reaction tube 2 is kept exhausted, the pressure inside the reaction tube 2 changes along with supply and stop of the purging process gas, so that fluorine contaminants present in the surface of the reaction tube 2 and so forth are reliably discharged.

As in the first embodiment, in order to efficiently generate radicals, the combined flow rate of hydrogen and oxygen in the purging process gas should be larger. The ratio of the flow rate of hydrogen relative to the combined flow rate of hydrogen and oxygen is set to be 1% to 99%, preferably to be 30% to 70%, and more preferable to be more than 50%. Where the purging process is performed under such conditions, the effect of removing fluorine elements present at the inner surface of the reaction tube 2 is improved.

In the radical purge step, the temperature inside the reaction tube 2 is set to be 300° C. to 1,050° C. If this temperature is lower than 300° C., fluorine elements present in the surface of the reaction tube 2 and so forth cannot be easily discharged (diffused). If this temperature is higher than 1,050° C., it exceeds the softening point of quartz constituting the reaction tube 2. Where this removal of fluorine contaminants is preformed along with the removal of metal contaminants described previously, the process temperature of the radical purge step is preferably set in accordance with that used for the removal of metal contaminants.

On the other hand, where there is no need to consider removal of metal contaminants, this removal of fluorine contaminants can be performed at a far lower temperature. In this case, where the temperature of the radical purge step is set to have a smaller difference relative to the cleaning step and/or film formation step, it is possible to improve the processing rate and the apparatus burden. In light of this, where there is no need to consider removal of metal contaminants, the temperature inside the reaction tube 2 used in the radical purge step is preferably set to be 300° C. to 800° C., and more preferably to be 400° C. to 600° C.

In the radical purge step, the pressure inside the reaction tube 2 during gas supply is set to be 53,200 Pa (400 Torr) or less. If this pressure is higher than 53,200 Pa, fluorine contaminants cannot be easily discharged from quartz of the reaction tube 2. However, it is not preferable to set this pressure to be far higher with a different order of magnitude as compared to the pressure of the film formation step. In light of this, this pressure is preferably set to be 13.3 Pa (0.1 Torr) to 532 Pa (4 Torr), and more preferably to be 13.3 Pa (0.1 Torr) to 133 Pa (1 Torr). Where the pressure inside the reaction tube 2 is set at such a low value, discharge of fluorine elements is promoted in the radical purge step.

After the radical purge step is finished, the supply of the purging process gas through the process gas feed lines 17 is stopped. Then, the interior of the reaction tube 2 is exhausted, and nitrogen is supplied through the purge gas feed line 18 into the reaction tube 2 at a predetermined flow rate, as shown in FIG. 7, (c). By doing so, the gas inside the reaction tube 2 is exhausted to the exhaust line 5 (nitrogen purge step).

Then, the interior of the reaction tube 2 is set by the heater 16 at a predetermined temperature, such as 400° C., as shown in FIG. 7, (a). Further, nitrogen is supplied through the purge gas supply line 18 into the reaction tube 2 at a predetermined flow rate, as shown in FIG. 7, (c). The pressure inside the process tube 2 is thereby returned to atmospheric pressure, as shown in FIG. 7, (b). Then, the lid 6 is moved down by the boat elevator 128, and the wafer boat 11 is thereby unloaded (unload step).

As the processes described above are being performed, the by-product films and fluorine contaminants present at the inner surface of the reaction tube 2, the surface of the wafer boat 11, and so forth are removed. Thereafter, the wafer boat 11 with a new lot of semiconductor wafers W supported thereon is placed on the lid 6, and the film formation process is started again in the manner described above.

Experiment 3

Figures 8, 9:
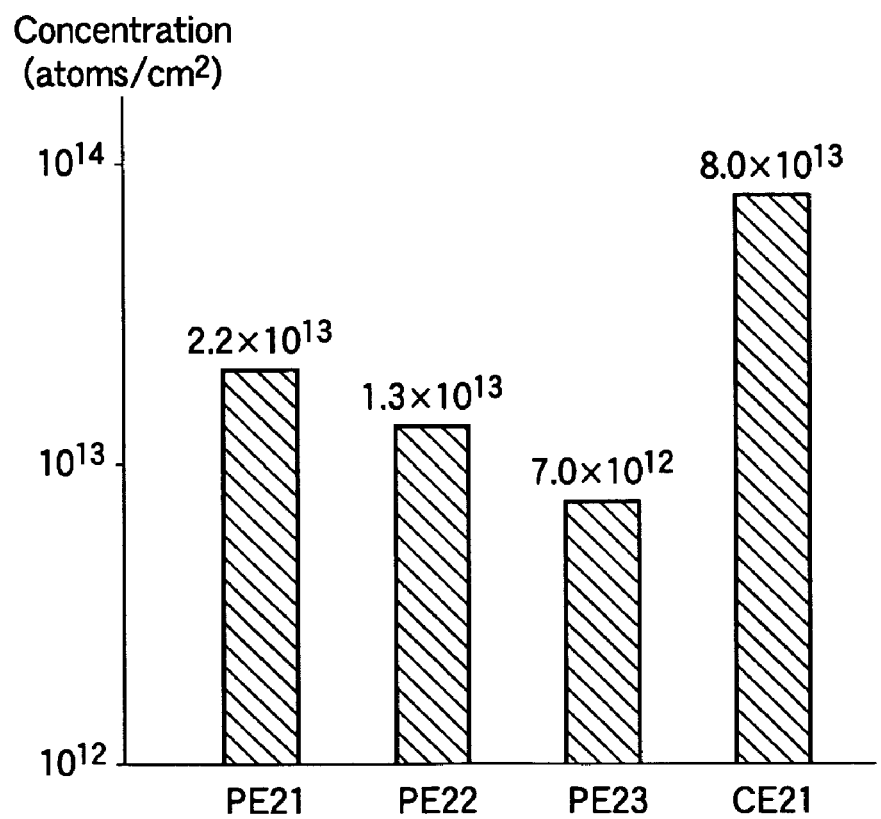
FIG. 8 is a diagram showing purging process conditions used for present examples PE21 to PE23 of the second embodiment and a comparative example CE21 in an experiment 3.
FIG. 9 is a graph showing the concentration of fluorine in a silicon nitride film, in the present examples PE21 to PE23 and comparative example CE21 obtained by the experiment 3.

As present examples PE21, PE22, and PE23 of the second embodiment, the film formation process, cleaning process, and purging process were performed under conditions in accordance with those described in the embodiment, in the heat-processing apparatus shown in FIGS. 1 and 2, so that the reaction tube 2 was prepared. In the present examples PE21, PE22, and PE23, the composition of the purging process gas was change, and the time period of the radical purge step was set at different values. As a comparative example CE21, the film formation process and cleaning process were performed under the same conditions as those of the present example PE21, and then only nitrogen purge was performed in place of the purging process, so that the reaction tube 2 was prepared. FIG. 8 is a diagram showing purging process conditions used for the present examples PE21 to PE23 of the second embodiment and the comparative example CE21 in the experiment 3. Semiconductor wafers were loaded into each reaction tube 2 thus prepared, and then the film formation process was performed under conditions in accordance with those described in the embodiment to form a silicon nitride film on the semiconductor wafers. Then, the semiconductor wafers were unloaded from the reaction tube 2, and the concentration (atoms/cm$^2$) of fluorine in the silicon nitride film was measured.

FIG. 9 is a graph showing the concentration of fluorine in the silicon nitride film, in the present examples PE21 to PE23 and comparative example CE21 obtained by the experiment 3. As shown in FIG. 9, the concentration of fluorine in the silicon nitride film became far lower in the present examples with the purging process. This data means that the purging process greatly decreases fluorine elements remaining inside the reaction tube 2.

<Consequence and Modification>

As described above, according to the first embodiment, the purging process is performed after the cleaning step, so that metal contaminants present inside the reaction tube 2 are removed. Consequently, the reaction tube 2 is prevented from discharging metal contaminants therefrom during the film formation process, whereby contamination, such as metal contamination, is suppressed on the formed film. On the other hand, according to the second embodiment, the purging process is performed after the cleaning step, so that fluorine contaminants present inside the reaction tube 2 are removed. Consequently, the reaction tube 2 is prevented from discharging fluorine contaminants therefrom during the film formation process, whereby contamination, such as fluorine contamination, is suppressed on the formed film.

In the first embodiment, iron, copper, and nickel are removed by the purging process, but they are merely examples of a removable metal contaminant. In this respect, other metal contaminants, such as aluminum (Al), cobalt (Co), sodium (Na), and/or calcium (Ca), may be removed by the purging process.

In the first and second embodiments, the purging process gas (metal removing gas or fluorine removing gas) is a mixture gas of oxygen, hydrogen, and nitrogen. However, the composition of the purging process gas can be suitably set, as long as it generates radicals by activation to remove a metal or fluorine from the inner surface of the reaction tube. For example, the purging process gas may be a mixture gas consisting of oxygen and hydrogen, or a mixture gas comprising a gas containing oxygen as an element and a gas containing hydrogen as an element.

In the first and second embodiments, the cleaning gas and purging process gases are activated when they are supplied into the reaction tube 2 heated to a predetermined temperature. Alternatively, the cleaning gas and/or purging process gas may be supplied into the reaction tube 2, while being activated outside the reaction tube 2 by an activation mechanism GAM (see FIG. 1), which is disposed on the corresponding process gas feed line 17. In this case, the temperature inside the reaction tube 2 can be lowered during the cleaning and radical purge steps. The activation mechanism GAM may be arranged to utilize one or more media selected from the group consisting of heat, plasma, light, and catalyst.

In the first and second embodiments, the purging process is performed subsequently after the cleaning process, but the purging process may be performed independently of the cleaning process as long as the inner surface of the reaction tube 2 is in a state for removing contaminants. For example, the purging process may be performed as a pre-process before a film formation process. Further, in the embodiments, the cleaning process and purging process are performed after the film formation process is repeated a plurality of times, but the cleaning process and purging process may be performed every time after the film formation process is performed. In this case, the interior of the reaction tube 2 is cleaned up every time, so that the formed thin films are more reliably prevented from suffering contamination.

In the first and second embodiments, the removal target is by-product films containing silicon nitride as the main component, which are deposited inside the reaction tube 2 when a silicon nitride film is formed on semiconductor wafers W. Alternatively, the present invention may be applied to a case where the removal target is by-product films that are deposited inside the reaction tube 2 when another silicon-containing insulating film (such as a silicon oxide film or silicon oxynitride film) is formed on semiconductor wafers W. In this case, in order to form a silicon oxide film or silicon oxynitride film, a first film formation gas containing a silicon-containing gas and a second film formation gas containing an oxidizing gas or oxynitriding gas may be supplied. Further, the present invention may be applied to a process for forming a polycrystalline silicon film on semiconductor wafers W. Each of these cases brings about a by-product film that contains, as a main component, a substance derived from a film formation gas used in the film formation process.

In the first and second embodiments, the cleaning gas is a mixture gas of fluorine, hydrogen, and nitrogen used as a dilution gas. However, the cleaning gas may be any gas, as long as it can remove a by-product film deposited due to the film formation process. The cleaning gas preferably contains a dilution gas, because the processing time can be more easily controlled if it is so arranged. However, the cleaning gas may contain no dilution gas. The dilution gas consists preferably of an inactive gas, such as nitrogen gas, helium gas (He), neon gas (Ne), or argon gas (Ar).

In the first and second embodiments, the process gas feed lines 17 are disposed in accordance with the type of gases. Alternatively, for example, process gas feed lines 17 may be disposed in accordance with the type of process steps. Further, a plurality of process gas feed lines 17 may be connected to the sidewall of the reaction tube 2 near the bottom, to supply each gas through a plurality of lines. In this case, a process gas is supplied through the plurality of process gas feed lines 17 into the reaction tube 2, and thereby more uniformly spreads in the reaction tube 2.

In the first and second embodiments, the heat-processing apparatus employed is a heat-processing apparatus of the batch type having a single-tube structure. However, for example, the present invention may be applied to a vertical heat-processing apparatus of the batch type having a reaction tube of the double-tube type, which is formed of inner and outer tubes. Alternatively, the present invention may be applied to a heat-processing apparatus of the single-substrate type. The target substrate is not limited to a semiconductor wafer W, and it may be a glass substrate for, e.g., an LCD.

The control section 100 of the heat-processing apparatus is not limited to a specific system, and it may be realized by an ordinary computer system. For example, a program for executing the process described above may be installed into a multi-purpose computer, using a storage medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined storage medium, as described above. In this case, for example, a program may be pasted on a bulletin board (BBS) on a communication network, and then supplied through a network while being superimposed on a carrier wave. The program thus provided would then be activated and ran under the control of the OS of the computer, as in the other application programs, thereby executing the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of using a vertical film formation apparatus in a semiconductor process for performing a film formation process on a plurality of target substrates together at a time inside a reaction chamber having an inner surface consisting essentially of a material selected from the group consisting of quartz and silicon carbide, the method comprising:

setting an idling state where the reaction chamber accommodates no product target substrates therein; and then, performing a purging process of removing contaminant metal present in the inner surface of the reaction chamber under the idling state by supplying a purging process gas into the reaction chamber while exhausting gas from inside the reaction chamber, and causing radicals generated by activating the purging process gas to act on the inner surface of the reaction chamber, wherein the contaminant metal includes one or more metals selected from the group consisting of iron, copper, and nickel, the purging process as contains oxygen gas and hydrogen gas such that a combined flow rate of the oxygen gas and the hydrogen gas relative to a total flow rate of the purging process gas is set at a ratio of 90 to 100% and a flow rate of the hydrogen gas relative to the combined flow rate of the oxygen gas and the hydrogen gas is set at a ratio of 50 to 70%, and the purging process employs therethrough a purging process temperature of 400 to 1,050° C. and a purging process pressure of 13.3 to 133 Pa, both set inside the reaction chamber to promote discharge of the contaminant metal from the inner surface of the reaction chamber.

2. The method according to claim 1, wherein the purging process temperature is set at a temperature to activate the purging process gas.

3. The method according to claim 1, wherein the purging process comprises activating the purging process gas outside the reaction chamber.

4. The method according to claim 3, wherein the purging process gas is activated by use of one or more media selected from the group consisting of heat, plasma, light, and catalyst.

5. The method according to claim 1, wherein, between said setting the idling state and said performing the purging process, the method further comprises performing a cleaning process of removing a by-product film from the inner surface of the reaction chamber under the idling state by supplying a cleaning gas different from the purging process gas into the reaction chamber.

6. The method according to claim 5, wherein the cleaning process comprises supplying the cleaning gas into the reaction chamber while exhausting gas from inside the reaction chamber, and setting a temperature and a pressure inside the reaction chamber to activate the cleaning gas.

7. The method according to claim 5, wherein the by-product film contains as a main component a substance selected from the group consisting of silicon nitride, silicon oxide, silicon oxynitride, and poly-crystalline silicon, and the cleaning gas contains halogen gas and hydrogen gas as elements.

8. The method according to claim 7, wherein, before said setting the idling state, the method further comprises performing a film formation process of forming a film of a material selected from the group consisting of silicon nitride, silicon oxide, silicon oxynitride, and poly-crystalline silicon on product target substrates by CVD inside the reaction chamber, and the by-product film contains, as a main component, a substance derived from a film formation gas used in the film formation process.

9. The method according to claim 1, wherein the purging process gas consists of oxygen gas and hydrogen gas or consists of oxygen gas, hydrogen gas, and nitrogen gas.

10. The method according to claim 7, wherein the cleaning gas contains fluorine as an element.

11. The method according to claim 2, wherein the purging process temperature is set at a temperature of 800 to 1,050° C.

12. A method of using a vertical film formation apparatus in a semiconductor process for performing a film formation process on a plurality of target substrates together at a time inside a reaction chamber having an inner surface consisting essentially of a material selected from the group consisting of quartz and silicon carbide, the method comprising:

setting a first idling state where the reaction chamber accommodates no product target substrates therein;

then, performing a pre-purging process of removing contaminant metal present in the inner surface of the reaction chamber under the first idling state by supplying a pre-purging process gas into the reaction chamber while exhausting gas from inside the reaction chamber, and causing radicals generated by activating the pre-purging process gas to act on the inner surface of the reaction chamber, wherein the contaminant metal includes one or more metals selected from the group consisting of iron, copper, and nickel, the pre-purging process gas contains oxygen gas and hydrogen gas such that a combined flow rate of the oxygen gas and the hydrogen gas relative to a total flow rate of the pre-purging process gas is set at a ratio of 90 to 100% and a flow rate of the hydrogen gas relative to the combined flow rate of the oxygen gas and the hydrogen gas is set at a ratio of 50 to 70%, and the pre-purging process employs therethrough a pre-purging process temperature of 800 to 1,050° C. and a pre-purging process pressure of 13.3 to 133 Pa, both set inside the reaction chamber to activate the pre-purging process gas and to promote discharge of the contaminant metal from the inner surface of the reaction chamber;

then, performing a plurality of times, a film formation process of forming a film of a material selected from the group consisting of silicon nitride, silicon oxide, silicon oxynitride, and poly-crystalline silicon on product target substrates by CVD inside the reaction chamber, wherein a by-product film consisting mainly of a substance derived from a film formation gas used in the film formation process is deposited on the inner surface of the reaction chamber;

then, setting a second idling state where the reaction chamber accommodates no product target substrates therein;

then, performing a cleaning process of removing the by-product film from the inner surface of the reaction chamber under the second idling state by supplying a cleaning gas containing fluorine as an element into the reaction chamber while exhausting gas from inside the reaction chamber, and setting a cleaning temperature and a cleaning pressure inside the reaction chamber to activate the cleaning gas; and then, performing a post-purging process of removing contaminant fluorine derived from the cleaning gas and present on the inner surface of the reaction chamber under the second idling state by supplying a post-purging process gas into the reaction chamber while exhausting gas from inside the reaction chamber, and causing radicals generated by activating the post-purging process gas to act on the inner surface of the reaction chamber, wherein the post-purging process gas contains oxygen gas and hydrogen gas such that a flow rate of the hydrogen gas relative to a combined flow rate of the oxygen gas and the hydrogen gas is set at a ratio of 30-70%, and the post-purging process employs therethrough a post-purging process temperature of 400 to 600° C. and a post-purging process pressure of 13.3 to 532 Pa, both set inside the reaction chamber.

13. The method according to claim 12, wherein each of the pre-purging process gas and the post-purging process gas consists of oxygen gas and hydrogen gas or consists of oxygen gas, hydrogen gas, and nitrogen gas.

14. The method according to claim 12, wherein the cleaning gas further contains hydrogen as an element.

15. The method according to claim 12, wherein the cleaning temperature is set at a temperature of 100 to 500° C. and the cleaning pressure is set at a pressure of 13,300 to 80,000 Pa.

* * * * *